(12) United States Patent
Roh et al.

(10) Patent No.: US 7,055,080 B2
(45) Date of Patent: May 30, 2006

(54) HIGH CODE RATE BLOCK CODING/DECODING METHOD AND APPARATUS

(75) Inventors: Jae-Woo Roh, Seoul (KR); Euiseok Hwang, Seoul (KR)

(73) Assignee: Daewoo Electronics Corp. (KR)

( * ) Notice: Subject to any disclaimer, the term of this patent is extended or adjusted under 35 U.S.C. 154(b) by 448 days.

(21) Appl. No.: 10/083,869

(22) Filed: Feb. 25, 2002

(65) Prior Publication Data

US 2003/0046629 A1   Mar. 6, 2003

(30) Foreign Application Priority Data

Aug. 30, 2001 (KR) ............................... 2001-52890
Aug. 30, 2001 (KR) ............................... 2001-52892

(51) Int. Cl.
*H03M 13/00* (2006.01)
(52) U.S. Cl. .................................................. 714/757
(58) Field of Classification Search ............... 714/757, 714/755, 753, 754, 758, 780, 790
See application file for complete search history.

(56) References Cited

U.S. PATENT DOCUMENTS 6,574,775 B1 *  6/2003  Chouly ....................... 714/800

* cited by examiner

*Primary Examiner*—Albert Decady
*Assistant Examiner*—James C. Kerveros
(74) *Attorney, Agent, or Firm*—Anderson Kill & Olick, PC

(57) ABSTRACT

A block coding algorithm uses an original block group having n+1 original blocks of m-bit message, which a first original block of m-bit message is encoded as a reference block of n-bit codeword and n original blocks of m-bit message placed after the first original block of m-bit message are encoded as n weighted blocks of n-bit codeword, based on a bit sequence of the reference block. A block decoding algorithm decodes n weighted blocks to generate corresponding original blocks of m-bit message and reconstructs the first original block of m-bit message from a sequence of reference bits, wherein each reference bit implies whether each of n weighted blocks is an A type weighted block or a B type weighted block.

19 Claims, 7 Drawing Sheets

HIGH CODE RATE BLOCK CODING/DECODING METHOD AND APPARATUS

FIELD OF THE INVENTION

The present invention relates to a block coding and decoding method and apparatus; and, more particularly, to a block coding and decoding method and apparatus capable of increasing a code rate.

BACKGROUND OF THE INVENTION

As is well known, demands for optically storing a large amount of data, such as data for a motion picture film, have been increasing. Therefore, various types of volume holographic data storage (VHDS) system incorporating therein a storage medium have been recently developed for realizing high density optical storage capabilities.

In the VHDS system, source data is segmented into blocks of N data bits, which are also called information bits or message bits, each block capable of representing any of $2^N$ distinct messages, N being a positive integer. An encoder in the VHDS system transforms each N-bit data block into a larger block of (N+K) bits, called code bits or channel symbols, K being another integer. The K bits, which the encoder adds to each data block, are called redundant bits, parity bits or check bits: they carry no new information. The code is referred to as an (N+K, N) code. The ratio of redundant bits to data bits, K/N, within a block is called redundancy of the code and the ratio of data bits to total bits, N/(N+K), is called a code rate. The code rate may be thought of as the portion of code bits that constitutes information. For example, in a code rate ⅓ code, each code bit carries ⅓ bit of information. If, for example, an error control technique employs a code rate ⅓, the bandwidth expansion is 3.

In other words, the encoder transforms a block of N message digits (a message vector) into a longer block of N+K codeword digits (a code vector), constructed from a given alphabet of elements. When the alphabet consists of two elements (0 and 1), the code is a binary code comprised of binary digits (bits). The explanation provided herein will be confined to binary codes, unless otherwise noted.

The N-bit message forms $2^N$ distinct message sequences referred to as N-tuples (sequences of N digits). The (N+K)-bit blocks can form as many as $2^{N+K}$ distinct sequences, referred to as (N+K)-tuples. The encoding procedure assigns to each of the $2^N$ message N-tuples different one of the $2^{N+K}$ (N+K)-tuples. A block code represents a one-to-one assignment, whereby the $2^N$ message N-tuples are uniquely mapped into a new set of $2^N$ codeword (N+K)-tuples; and the mapping can be accomplished via a look-up table.

In the decoding mode, a multiplicity of decoding algorithms has been used in order to increase the code rate while decreasing the bit error rate.

In a threshold decoding algorithm, a threshold, e.g., an average value or a predetermined value such as 0.5, may be used to assign '0' or '1' to a retrieved or transmitted signal disturbed by channel distortion. In a conventional VHDS system, Gaussian distribution characteristics of a laser beam, lens distortions, scattering and diffraction in the system and so on may be appreciated as a channel. The threshold decoding algorithm has a higher code rate, but also has a higher bit error rate, especially, in case of a lower intensity of laser beam.

An improvement in the bit rate error may be realized by using a local threshold decoding algorithm. The local threshold decoding algorithm divides a decoding region into a plurality of local regions and applies a different threshold for each local region so as to determine '0' or '1'. The local threshold decoding algorithm however has a low compatibility because each of the VHDS systems has intrinsic noise patterns different from each other.

Another improvement may be realized by using a binary differential coding/decoding algorithm. The binary differential decoding algorithm takes advantage of a characteristic that a signal for representing '1' is always larger than a signal for representing its nearest '0'. For example, '0' and '1' are replaced with '01' and '10', respectively, during encoding and its reverse algorithm is used to decode a transmitted signal. The binary differential decoding algorithm has a lower bit error rate, but its code rate is also considerably (50%) decreased.

Another improvement may be achieved by employing a balanced block coding/decoding algorithm. In encoding, an input message is divided into a plurality of message P-tuples, P being a positive integer and each message P-tuple is encoded with a codeword 2Q-tuple having an equal number of bit "0's" and bit "1's", Q being an integer and 2Q being larger than P. In decoding, a transmitted signal is divided into a plurality of codeword 2Q-tuples; and Q number of smaller and greater received values for each codeword 2Q-tuple are reconstructed as "0's" and "1's", respectively.

For example, in a 6:8 balanced block coding/decoding algorithm, $2^6(=64)$ 8 bit codewords which have a same number, i.e., 4, of "0" and "1" bits among $2^8(=256)$ 8 bit codewords are selected to encode 64 message 6-tuples. For instance, 64 balanced blocks selected among $_8C_4(=70)$ 8 bit codewords are used to represent 64 original message blocks of 6-tuples.

Also, in an 8:12 balanced block coding/decoding algorithm, $2^8(=256)$ codeword 12-tuples which have a same number, i.e., 6, of "0" and "1" bits among $2^{12}(=4096)$ 12 bit codewords are selected to encode 256 message 8-tuples. For instance, one of 256 codewords selected from $_{12}C_6(=924)$ codeword 12-tuples is used to represent an original block of 8-bit message.

The 6:8 balanced block coding algorithm has a code rate ¾(75%) since the 6:8 balanced block has 2 redundant bits added to 6 data bits. And, the 8:12 balanced block coding algorithm has a code rate ⅔(=66.7%), since the 8:12 balanced block has 4 redundant bits to 8 data bits. The balanced block coding algorithm has a lower bit error rate and a higher code rate than the binary differential coding algorithm; however, a still higher code rate is required to use a limited channel resource effectively.

SUMMARY OF THE INVENTION

It is, therefore, a primary object of the present invention to provide a block coding/decoding method capable of increasing a code rate while maintaining a low bit error rate.

It is, further, another object of the present invention to provide a block coding/decoding apparatus capable of increasing a code rate while maintaining a low bit error rate.

In accordance with one aspect of the invention, a preferred embodiment of the present invention provides a block encoding method, including steps of:

forming an original block group having n+1 original blocks of m-bit message, "m" being a positive integer and "n" being an odd integer greater than "m";

encoding a first original block of m-bit message of the original block group to a reference block of n-bit codeword; and encoding n original blocks of m-bit message placed after the first original block of m-bit message in the original block group to generate n weighted blocks of n-bit codeword, each of which corresponds to an A type weighted block or a B type weighted block, depending on a bit sequence of the reference block.

In accordance with one aspect of the invention, another preferred embodiment of the present invention provides a block decoding method, including steps of:

forming a coding group having n weighted blocks of n-bit codeword, "n" being an odd integer;

generating a sequence of reference bits from the n weighed blocks of n-bit codeword, wherein each reference bit implies that a corresponding weighted block is an A type weighted block or a B type weighted block;

decoding the n weighted blocks of n-bit codeword of the coding group to generate n corresponding original blocks of m-bit message; and reconstructing a first original block of m-bit message from the sequence of the reference bits.

In accordance with another aspect of the invention, still another preferred embodiment of the present invention provides a block encoding/decoding apparatus, including:

a buffering device for outputting a digitalized image signal on a basis of an original block of m-bit message and generating a timing signal for notifying when the original block is outputted, "m" being a positive integer;

a first control part for determining whether the original block is a first original block of m-bit message when the timing signal is first generated from the first buffer;

an encoding part for encoding, if the original block is the first original block, the first original block as a reference block of n-bit codeword, and if otherwise, encoding the original block as a weighted block of n-bit codeword, which is represented as an A type weighted block of n-bit codeword or a B type weighted block of n-bit codeword, under a control of the first control part based on a bit sequence of the reference block, "n" being an odd integer larger than "m";

a switch for transmitting the reference block to the first control part and transmitting the weighted block to a storage medium;

a buffer having a reference buffer for storing a sequence of reference bits, wherein each reference bit implies whether the weighted block is an A type weighted block or a B type weighted block, and n buffers for storing bits of the weighted block provided from the storage medium;

a second control part for determining whether the weighted block is an A type weighted block or a B type weighted block; and decoding part for decoding the weighted block to generate a corresponding original block of m-bit message and reconstructing the first original block from the sequence of the reference bits.

BRIEF DESCRIPTION OF THE DRAWINGS

The above and other objects and features of the present invention will become apparent from the following description of preferred embodiments given in conjunction with the accompanying drawings, in which.

DETAILED DESCRIPTION OF THE PREFERRED EMBODIMENTS

In an m:n block coding algorithm in accordance with the present invention, a weighted block of n-bit codeword represents an original block of m-bit message. However, in order to perform the block coding and decoding algorithm in accordance with the present invention, the number of possible codewords in the weighted block should be determined. Herein, the number of the possible codewords is determined based on selectable combinations of the weighted blocks of n-bit codeword. The selectable combinations of the weighted blocks of n-bit codeword are decided based on whether the weighted block is an A type weighted block or B type weighted block. An A type weighted block and a B type weighted block are distinguished by means of the bit number of "1" or "0" in the weighted block of n-bit codeword.

In the m:n block coding and decoding algorithm in accordance with the present invention, the bit number "a" of "1" in the weighted block of n bits can be calculated as follows:

$$2^m < {}_nC_a \tag{1}$$

wherein "m" and "a" are positive integers, respectively, and "n" is an odd integer larger than "m" and "a".

Since "a" is related to the number of bit "1" in one of two weighted blocks, the number "t" of bit "1" in the other weighted block can be calculated as follows:

$$t = n - a \tag{2}$$

For example, in the 8:11 block coding and decoding algorithm, "a" should satisfy a relationship $256 < {}_{11}C_a$ wherein "a" is a positive integer between 4 and 7. Therefore, the 8:11 block coding algorithm has two selectable combinations.

A first selectable combination in the 8:11 block coding and decoding algorithm consists of 4 and 7. For instance, if an A type weighted block of 11 bits has four bits of "1" and seven bits of "0" (or seven bits of "1" and four bits of "0"), each weighted block of 11 bits may be expressed as one of ${}_{11}C_4(=330)$ codewords. Since the original block of 8 bits is expressed as one of $2^8(=256)$ 8-bit messages, only 256 codewords among 330 codewords must be selected to represent 256 8-bit messages.

A second selectable combination in the 8:11 block coding and decoding algorithm consists of 5 and 6. If an A type weighted block of 11 bits has five bits of "1" and six bits of "0" (or six bits of "1" and five bits of "0"), the weighted block of 11 bits may be expressed as one of $_{11}C_5(=462)$ codewords. Since the original block of 8 bits is expressed as one of $2^8$ 8-bit messages, 256 codewords may be selected among 462 codewords to sufficiently represent 256 messages.

One weighted block of n-bit codeword is used as only a reference block and n weighted blocks of n-bit codeword are coded in accordance with the block coding and decoding algorithm of the present invention The block coding and decoding algorithm, for example, the 8:11 block coding and decoding algorithm, in accordance with the present invention will be explained in detail, hereinafter.

Figure 1:
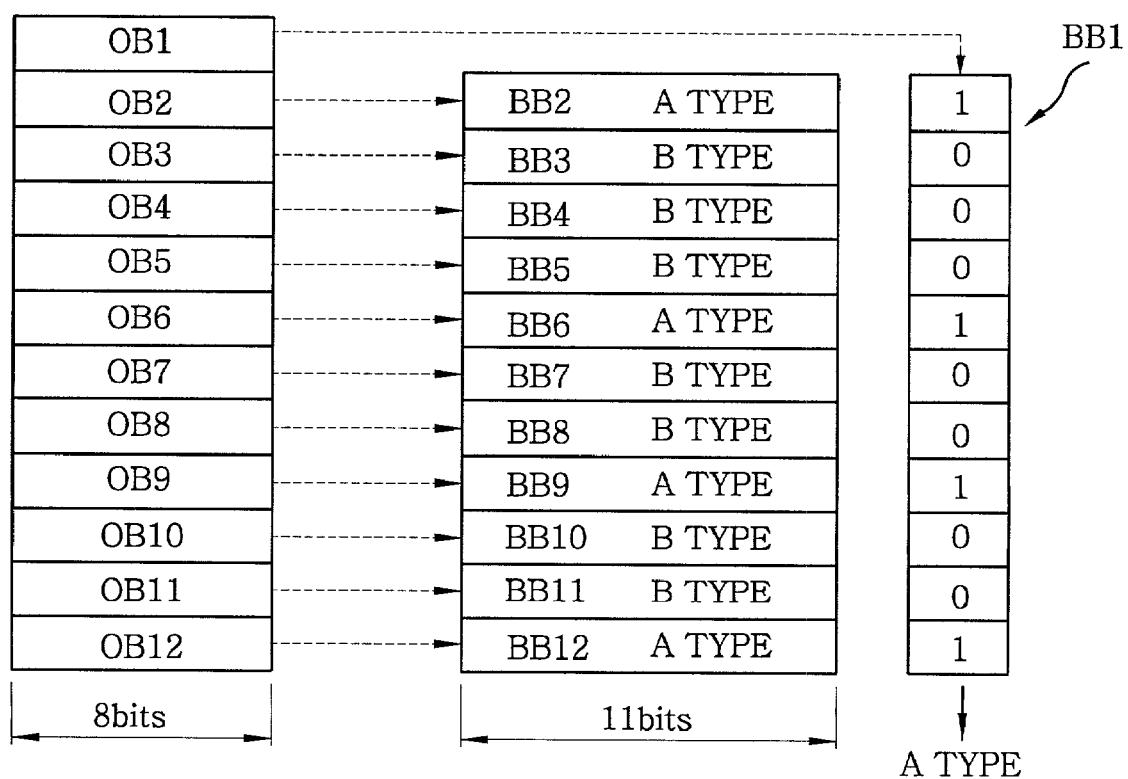
FIG. 1 represents a block diagram for illustrating a block coding and decoding algorithm in accordance with a first preferred embodiment of the present invention.

FIG. 1 shows a block diagram of the 8:11 block coding and decoding algorithm in accordance with a first preferred embodiment of the present invention. In the 8:11 block coding and decoding algorithm, 12 original blocks OB1 to OB12 of 8-bit message are coded as 12 weighted blocks BB1 to BB12 of 11-bit codeword. It is assumed that a first weighted block BB1 of 11-bit codeword is coded as an A type weighted block having four bits of "1" and seven bits of "0". In another embodiment of the present invention, the first weighted block BB1 of 11-bit codeword may be coded as a B type weighted block having seven bits of "1" and four bits of "0".

A first original block OB1 of 8-bit message is represented as a first weighted block BB1 of 11-bit codeword. The first weighted block BB1 of 11-bit codeword will hereinafter be referred as a reference block RB of 11-bit codeword, and 11 bits of the reference block RB respectively represent coding types of the 11 weighted blocks BB2–BB12 respectively corresponding to the original blocks OB2 to OB12 of 8-bit message.

The original blocks OB2 to OB12 of 8-bit message placed after the first original block OB1 of 8-bit message are represented as 11 weighted blocks BB2 to BB12 of 11-bit codeword, to thereby form a coding group. Each of the weighted blocks BB2 to BB12 is decided as either an A type weighted block or a B type weighted block based on a bit sequence of the reference block RB.

Referring to FIG. 1, the reference block RB is an A type weighted block of 11-bit codeword having a bit sequence 10001001001. Assuming that one bit "1" of the reference block RB of 11-bit codeword is set to represent an A type weighted block of 11-bit codeword and the other bit "0" of the reference block RB of 11-bit codeword is set to stand for a B type weighted block of 11-bit codeword, a second original block OB2 of 8-bit message is represented as an A type weighted block of 11-bit codeword since a first bit of the reference block RB of 11-bit codeword is "1", and a third original block OB3 of 8-bit message is represented as a B type weighted block of 11-bit codeword since a second bit of the reference block RB of 11-bit codeword is "0". Accordingly, the coding group has four A type weighted blocks BB2, BB6, BB9 and BB12, and seven B type weighted blocks BB3, BB4, BB5, BB7, BB8, BB10 and BB11.

The coding group are transmitted to a storage medium (not shown) as a recording medium and a holographic storage medium or an external device (not shown), while the reference block RB is not transmitted to the storage medium or the external device and 11 bits of the reference block RB are erased in a block coding system. However, the reference block RB can be reconstructed by means of the 8:11 block decoding algorithm.

In the 8:11 block decoding algorithm, the coding group is divided on a basis of a weighted block of 11-bit codeword and then 11 bits of the weighted block of 11-bit codeword are summed up. If the weighted block of 11-bit codeword is an A type weighted block of 11-bit codeword, the summation result is 4 since the A type weighted block has four bits of "1" and seven bits of "0", and if the weighted block of 11-bit codeword is a B type weighted block of 11-bit codeword, the summation result is 7 since the B type weighted block has seven bits of "1" and four bits of "0". Therefore, the A type weighed blocks have smaller summation result than the B type weighted blocks.

Referring to FIG. 1, since the reference block RB has been an A type weighted block having four bits of "1" and seven bits of "0" and the 11 weighted blocks BB2 to BB12 are decided by 11 bits of the reference block RB, it is ensured that four weighted blocks having smaller total results in the coding group are A type weighted blocks and seven weighted blocks having greater total results in the coding group are B type weighted blocks.

Meanwhile, since a bit "1" has been set to an A type weighted block and a bit "0" has been set to a B type weighted block in the 8:11 block coding algorithm, each of the weighted blocks BB2 to BB12 produces a reference bit. Therefore, the coding group can be represented as a sequence of reference bits 10001001001. This is equal to the bit sequence of the reference block RB. Therefore, it will become apparent to those skilled in the art that the reference block RB can be reconstructed in the block decoding system and all the weighted blocks BB1 to BB12 can be decoded to the original blocks OB1 to OB12.

Hereinafter, the block coding and decoding system for the first preferred embodiment of the present invention will be explained.

Figure 2:
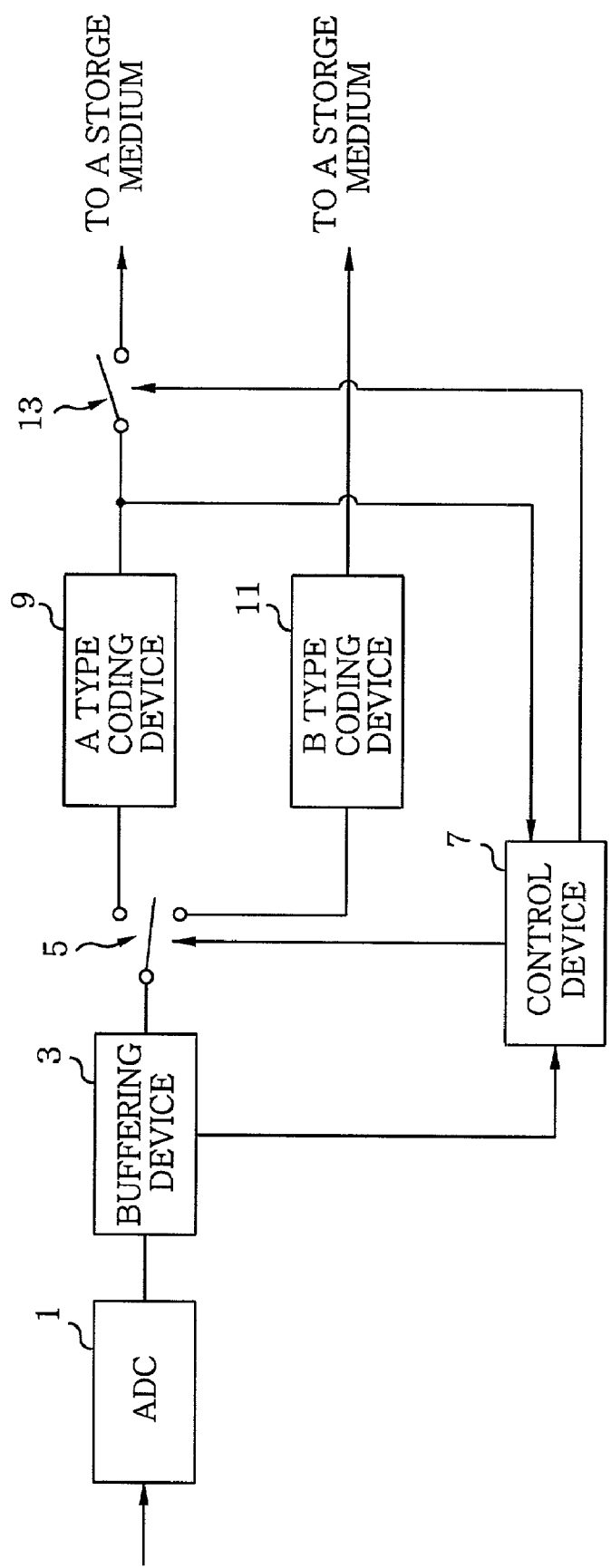
FIG. 2 shows a block diagram for illustrating a block coding system in accordance with the first preferred embodiment of the present invention.

FIG. 2 shows a block diagram for illustrating a block coding system in accordance with the first preferred embodiment of the present invention. The block coding system includes an analog-to-digital converter (ADC) 1, a buffering device 3, a first switch 5, a control device 7, an A type coding device 9, a B type coding device 11 and a second switch 13.

The ADC 1 digitizes an input image signal and provides a digitized image signal to the buffering device 3. The buffering device 3 outputs the digitized image signal on a basis of an original block of m-bit message, "m" being a positive integer, and generates a timing signal for notifying when the original block of m-bit message is outputted.

The first switch 5 transmits the original block from the buffering device 3 to the A type coding device 7 or the B type coding device 9 under a control of the control device 7.

The control device 7 incorporates a counting unit (not shown) therein, to thereby count the number of the timing signal provided from the buffering device 3. Since the m:n block coding algorithm in accordance with the present invention needs one original block of m-bit message for one reference block of n-bit codeword and n original blocks of m-bit message for the coding group of n weighted blocks, the counting unit resets on receiving an $(n+1)^{st}$ timing signal, "n" being a positive integer.

The control device 7 controls the first switch 5 to be connected to the A type coding device 9 on receiving a first timing signal from the buffering device 3. For instance, when the count number of the counting unit is 1, the first original block of m-bit message is transmitted to the A type coding device 9. The control device 7 also controls the first switch 5 to be connected to the A type coding device 9 or the B type coding device 11 based on the bit sequence of the reference block RB on receiving a second to an $(n+1)^{st}$ timing signal. For instance, when the count number of the counting unit ranges from 2 to n+1, n original blocks of m-bit message except the first original block of m-bit message are transmitted to the A type coding device 9 or the B type coding device 11.

Further, the control device 7 controls the second switch 13 to be connected to a subsequent stage, e.g., a storage medium (not shown) as a recording medium and a holographic storage medium or an external device (not shown), while receiving the second to the $(n+1)^{st}$ timing signals. In other words, if receiving the first timing signal, the control device 7 controls the second switch 13 to be disconnected, and if otherwise, the control device 7 controls the second switch 13 to be connected to a subsequent stage.

The A type coding device 9 encodes the first original block of m-bit message transmitted from the buffering device 3 via the first switch 5, to thereby obtain a reference block RB of n-bit codeword. The A type coding device 9 also encodes a part of n original blocks of m-bit message, to thereby obtain A type weighted blocks of n-bit codeword, "n" being greater than "m". The B type coding device 11 encodes the remaining part of n original blocks of m-bit message, to thereby obtain B type weighted blocks of n-bit codeword. The B type weighted blocks of n-bit codeword are transmitted to a subsequent stage, e.g., the storage medium or the external device.

The second switch 13 is connected to the A type coding device 9. The second switch 13 is turned off, under the control of the control device 7 upon receiving the first timing signal, not to thereby transmit the reference block RB to the subsequent stage. The second switch 13 is turned on, under the control of the control device 7 upon receiving the second to the $(n+1)^{st}$ timing signal, to thereby transmit the A type weighted blocks to the subsequent stage, e.g., the storage medium or the external device.

Figure 3:
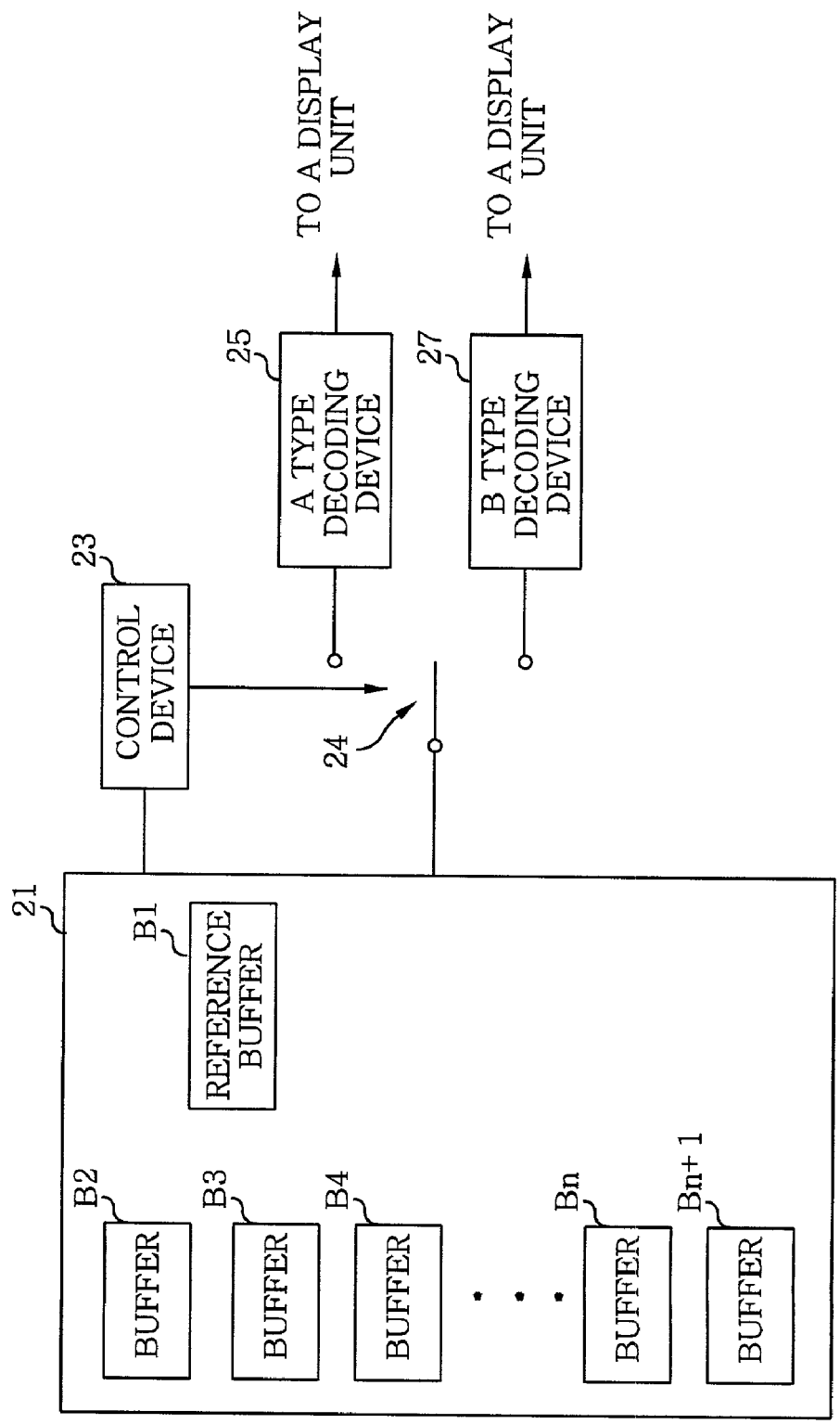
FIG. 3 describes a block diagram for illustrating a block decoding system in accordance with the first preferred embodiment of the present invention.

FIG. 3 describes a block diagram for illustrating a block decoding system in accordance with the first preferred embodiment of the present invention. The block decoding system includes a buffering circuit 21, a control device 23, a switch 24, an A type decoding device 25 and a B type decoding device 27.

The buffering circuit 21 has a plurality of the buffers B1 to Bn+1. Each buffer B2 to Bn+1 sequentially stores therein 11 bits of a weighted block provided from the block coding system. A reference buffer B1 stores a sequence of reference bits, each of which implies a weighted type of the weighted block stored in each buffer B2 to Bn+1.

The control device 23 connected to the buffering circuit 21 sums up 11 bits of the weighted block in each buffer B2 to Bn+1 and then determines, based on the summation result, whether the weighted block in each buffer B2 to Bn+1 is an A type weighted block or a B type weighted block. For instance, four weighted blocks having smaller summation result are determined to be A type weighted blocks and seven weighted blocks having larger summation result are determined to be B type weighted blocks. Referring to FIG. 1, each of the weighted blocks BB2, BB6, BB9 and BB12 corresponding to four bits of "1" is an A type weighted block and each of the weighted blocks BB3, BB4, BB5, BB7, BB8, BB10 and BB11 corresponding to seven bits of "1" is a B type weighted block.

After determining the weighted type, the control device 23 stores the sequence of the reference bits, each of which implies whether the weighted block is an A type weighted block or a B type weighted block, in the reference buffer B1. Since the sequence of the reference bits is same as the sequence of bit data of the reference block, the first weighted block of n-bit codeword seems to be stored in the reference buffer B1. Therefore, all the weighted blocks are stored in the buffers B1 to Bn+1.

Further, the control device 23 controls the switch 24 to be connected to the A type decoding device 25 or the B type decoding device 27.

The switch 24 connected to the buffering circuit 21 transmits the weighted blocks from the buffering circuit 21 to the A type decoding device 25 or the B type decoding device 27 under the control of the control device 23.

The A type decoding device 25 and the B type decoding device 27 decode an A type weighted block and a B type weighted block, respectively, to reconstruct original blocks. It is apparent to those skilled in the art that each of the weighted block is provided to the A type decoding device 25 or the B type decoding device 27 according to the weighted type since the weighted type of the weighted block in each buffer B2 to Bn+1 has been determined as described above.

Meanwhile, the sequence of the reference bits stored in the reference buffer B1 is not decoded as described above. The decoding of the reference bits depends on whether the first original block has been encoded to an A type weighted block or to a B type weighted block in the block coding system. For instance, if the reference block is an A type weighted block, the sequence of the reference bits is transmitted to an A type decoding device 25, and if otherwise, the sequence of the reference bits is transmitted to the B type decoding device 27.

The 8:11 block coding and decoding algorithm in accordance with the first preferred embodiment of the present invention has a code rate of 79.3% ($=96/121$) since it has 96 data bits for 12 original blocks of 8 bits to 121 coded bits for 11 weighted blocks of 11 bits.

However, this algorithm has different bit numbers of "1" and "0" in the coding group. For instance, the bit number of "1" in the coding group is 65 since there are four bits of "1" in each of four A type weighted blocks and each of seven bits of "1" in seven B type weighted blocks, and the bit number of "0" in the coding group is 56 since there are seven bits of "0" in each of four A type weighted blocks and four bits of "0" in each of seven B type weighted blocks. Therefore, the bit number of "1" is larger than that of "0" in this algorithm so that this algorithm does not form a balanced coding and decoding block.

However, in accordance with the second preferred embodiment of the present invention, it is possible to form the balanced coding and decoding block.

Figure 4:
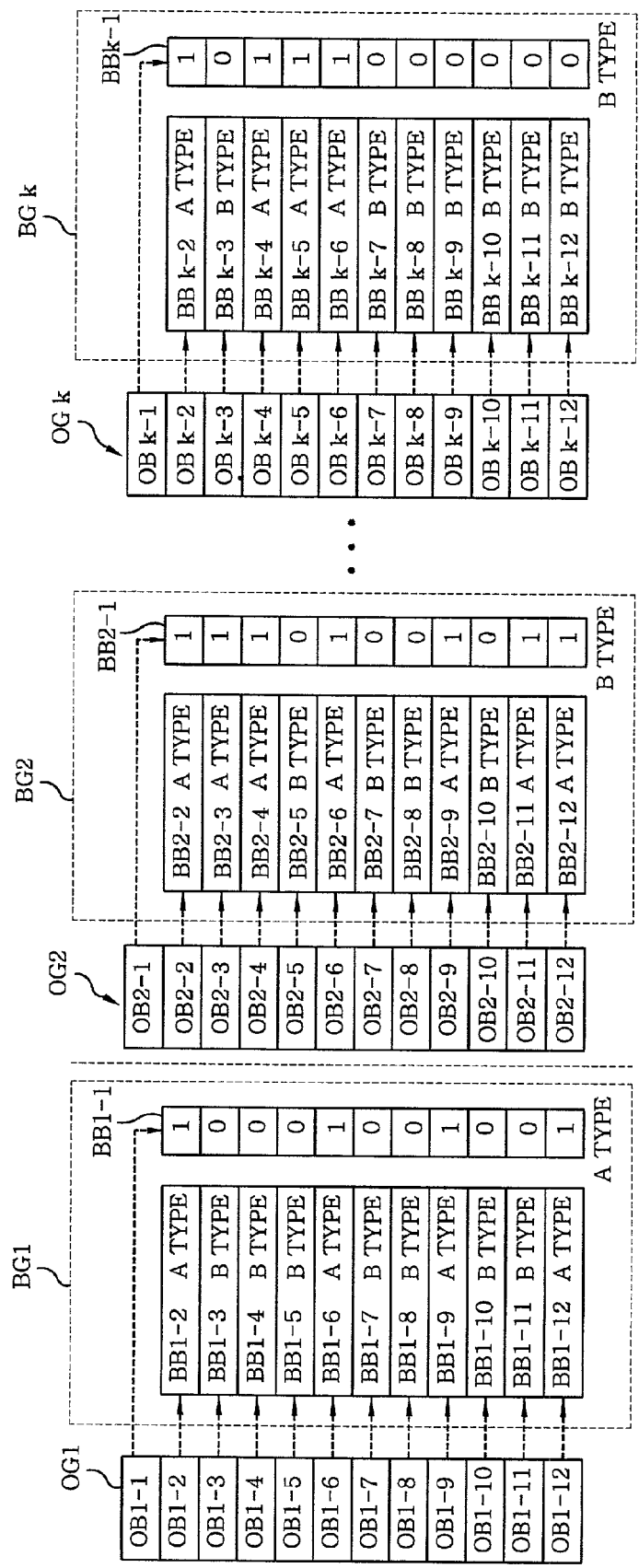
FIG. 4 offers a block diagram for illustrating a coding and decoding algorithm in accordance with a second preferred embodiment of the present invention.

FIG. 4 offers a block diagram for illustrating a coding and decoding algorithm in accordance with the second preferred embodiment of the present invention. It is assumed that a weighted block of 11-bit codeword is either an A type weighted block having four bits of "1" and seven bits of "0", or a B type weighted block having seven bits of "1" and four bits of "0".

First, 12 original blocks OB1-1 to OB1-12 of 8-bit message are set to form a first original block group OG1. A first original block OB1-1 of 8-bit message in the first original block group OG1 is represented as a first weighted block BB1-1 of 11-bit codeword. The first weighted block BB1-1 of 11-bit codeword will hereinafter be referred as a first reference block RB1 of 11-bit codeword, and 11 bits of the first reference block RB1 decide a weighting type of the original blocks OB1-2 to OB1-12 of 8-bit message.

11 original blocks OB1-2 to OB1-12 of 8-bit message placed after the first original block OB1-1 of 8-bit message are represented as 11 weighted blocks BB1-2 to BB1-12 of 11 bit codeword, to thereby form a first coding group BG1.

Each of the weighted blocks BB1-2 to BB1-12 is either an A type weighted block or a B type weighted block based on a bit sequence of the reference block RB1.

Similarly, next 12 original blocks OB2-1 to OB2-12 of 8-bit message are set to form a second original block group OG2. A first original block OB2-1 of 8-bit message in the second original block group OG2 is represented by a first weighted block BB2-1 of 11-bit codeword to be referred as a second reference block RB2 of 11-bit codeword, and 11 bits of the second reference block RB2 decide a weighting type of the original blocks OB2-2 to OB2-12 of 8-bit message. 11 original blocks OB2-2 to OB2-12 of 8-bit message placed after the first original block OB2-1 of 8-bit message are represented by 11 weighted blocks BB2-2 to BB2-12 of 11-bit codeword, to thereby form a second coding group BG2.

In this way, a plurality of coding groups BG1–BGk corresponding to a plurality of original block groups OG1–OGk are formed, wherein it is preferable that "k" be an even integer. Referring to FIG. 4, one of the coding groups BG1–BGk composed of 11 weighted blocks of 11-bit codeword corresponds to each of the original block groups OG1–OGk composed of 12 original blocks of 8-bit message.

If all reference blocks in the coding groups BG1–BGk are an A type weighted blocks, the block coding and decoding algorithm has also a different bit number of "1" and "0", thereby not to form a balanced coding block.

To solve the problem, in the block coding and decoding algorithm in accordance with the second preferred embodiment of the present invention, a $(2N-1)^{st}$ reference block, which is a reference block of a $(2N-1)^{st}$ coding group, is set to an A type weighted block while a $2N^{th}$ reference block, which is a reference block of a $2N^{th}$ coding group, is set to a B type weighed block, "N" being a positive integer. Then, when encoding the original block groups OG1–OGk, each of a second to an $(n+1)^{st}$ original blocks in the $(2N-1)^{st}$ original block group is encoded to be either an A type weighted block or a B type weighted block based on a bit sequence of the $(2N-1)^{st}$ reference block while each of a second to an $(n+1)^{st}$ original blocks in the $2N^{th}$ original block group is encoded to be either an A type weighted block or a B type weighted block based on a bit sequence of the $2N^{th}$ reference block.

Therefore, a $(2N-1)^{st}$ coding group and a $2N^{th}$ coding group corresponding to the $(2N-1)^{st}$ original block group and the $2N^{th}$ original block group, respectively, are combined to form a balanced coding group in which the number of bit "1" is equal to that of bit "0".

For example, if there are two coding groups BG1 and BG2, the number of bit "1" in the coding group BG1 is 65 since there are four bits of "1" in each of four A type weighted blocks and seven bits of "1" in each of seven B type weighted blocks while the number of bit "1" in the coding group BG2 is 56 since there are four bits of "1" in each of seven A type weighted blocks and seven bits of "1" in each of four B type weighted blocks. In the meantime, the number of bit "0" in the coding group BG1 is 56 since there are seven bits of "0" in each of four A type weighted blocks and four bits of "0" in each of seven B type weighted blocks while the number of bit "0" in the coding group BG2 is 65 since there are seven bits of "0" in each of seven A type weighted blocks and four bits of "0" in each of four B type weighted blocks. Therefore, the number of bit "1" in two coding groups BG1 and BG2 is equal to that of bit "0" in two coding groups BG1 and BG2 as 65+56=121.

For the simplicity, the number of bit "1" in only two block coding groups BG1 and BG2 are added together and the number of bit "0" in only two block coding groups BG1 and BG2 25 are added together; however, it will become apparent to those skilled in the art that the number of bit "1" in all the coding groups BG1–BGk is equal to that of bit "0" in all the coding groups BG1–BGk, k being an even integer.

The block decoding algorithm of the second preferred embodiment is performed in a reverse process.

The block decoding algorithm first classifies each of the coding groups BG1–BGk into either the $(2N-1)^{st}$ coding group or the $2N^{th}$ coding group. The decoding algorithm for the $(2N-1)^{st}$ coding group is similar to that in the first preferred embodiment, and thus the explanation therefor has been omitted.

The decoding algorithm for the $2N^{th}$ coding group, for example, the coding group BG2, divides the $2N^{th}$ coding group into 11 weighted blocks BB2-2 to BB2-12, so that 11 bits of each of the weighed blocks BB2-2 to BB2-12 are summed. If the weighted block of 11-bit codeword is an A type weighted block of 11-bit codeword, the summation result is 4 since an A type weighted block has four bits of "1" and seven bits of "0", and if the weighted block of 11-bit codeword is a B type weighted block of 11-bit codeword, the summation result is 7 since a B type weighted block has seven bits of "1" and four bits of "0". Therefore, A type weighted blocks have smaller summation result than B type weighted blocks.

Referring to FIG. 4, since the second reference block RB2 is a B type weighted block having seven bits of "1" and four bits of "0" and types of weighted blocks BB2-2 to BB2-12 are decided by 11 bits of the second reference block RB2, it is ensured that seven weighted blocks having smaller summation result in the coding group BG2 are A type weighted blocks while four weighted blocks having larger summation results in the coding group BG2 are B type weighted blocks.

Meanwhile, each of the weighted blocks BB2-2 to BB2-12 produces a reference bit. Since a bit of "1" corresponds to an A type weighted block while a bit of "0" corresponds to a B type weighted block, the coding group BG2 can be represented as a sequence of reference bits 11101001011. This is equal to the bit sequence of the second reference block RB2. Therefore, it will become apparent to those skilled in the art that the second reference block RB2 can be reconstructed in the block decoding system and all the weighted blocks BB2-1 to BB2-12 can be decoded as the original blocks OB2-1 to OB1-12.

Hereinafter, the block coding and decoding system for the second preferred embodiment of the present invention will be explained.

Figure 5:
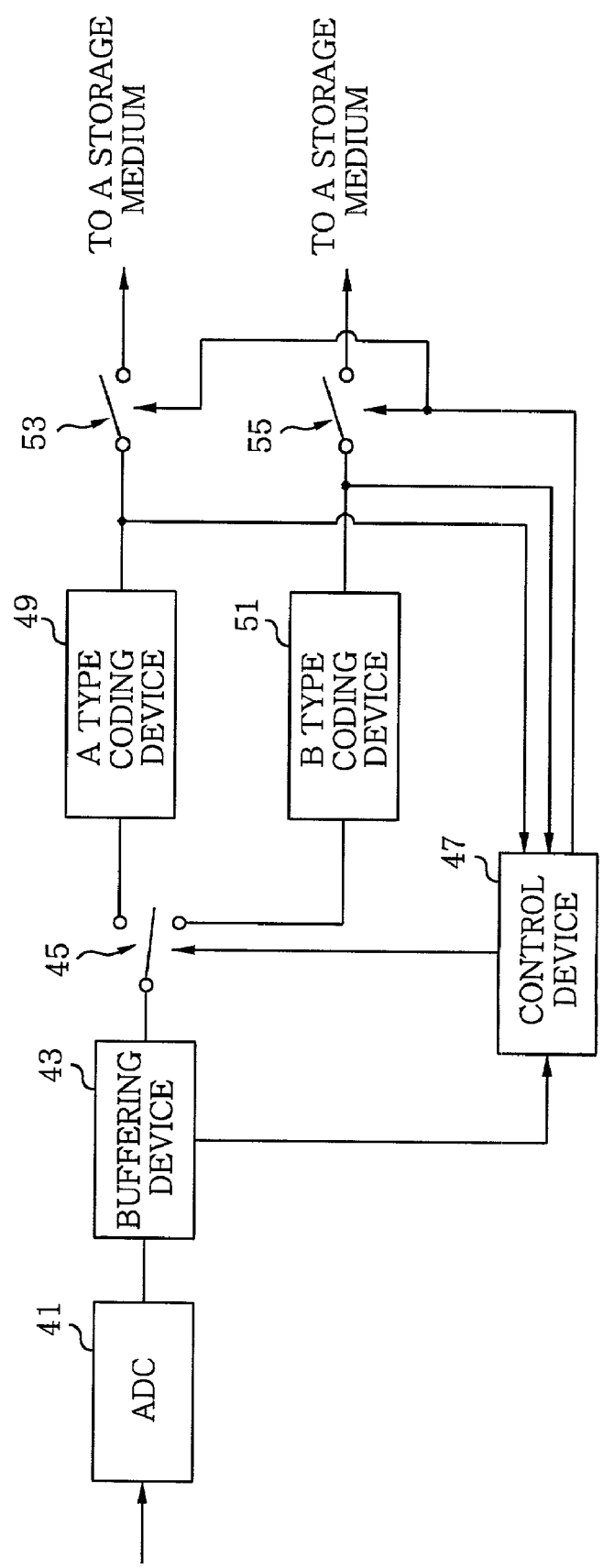
FIG. 5 presents a block diagram for illustrating a coding system in accordance with the second preferred embodiment of the present invention.

FIG. 5 presents a block diagram for illustrating a 20 block coding system in accordance with the second preferred embodiment of the present invention. The block coding system includes an analog-to-digital converter (ADC) 41, a buffering device 43, a first switch 45, a control device 47, an A type coding device 49, a B type coding device 51, a second switch and a third switch 55.

The ADC 41 digitizes an input image signal and provides a digitized image signal to the buffering device 43. The buffering device 43 outputs the digitized image signal on a basis of an original block of m-bit message, "m" being a positive integer, and generates a timing signal for notifying when the original block of m-bit message is outputted.

The first switch 45 transmits the original block from the buffering device 43 to the A type coding device 47 or the B type coding device 49 under a control of the control device 47.

The control device 47 incorporates a counting unit therein, to thereby count the number of the timing signal provided from the buffering device 43. Since the m:n block coding algorithm in accordance with the present invention needs a first original block of m-bit message for the reference block of n-bit codeword and n original blocks of m-bit message for the coding group of n weighted blocks, the counting unit is reset on receiving an $(n+1)^{st}$ timing signal, "n" being a positive integer.

The control device 47 controls the first switch 45 to be connected to the A type coding device 49 on receiving a first timing signal from the buffering device 43. For instance, when the count number of the counting unit is 1, the first original block of m-bit message is transmitted to the A type coding device 49. The control device 47 also controls the first switch 5 to be connected to the A type coding device 49 or the B type coding device 51 based on the bit sequence of the reference block RB on receiving a second to an $(n+1)^{st}$ timing signals. For instance, when the count number of the counting unit ranges from 2 to n+1, n original blocks of m-bit message except the first original block of m-bit message are transmitted to the A type coding device 49 or the B type coding device 51.

Further, the control device 47 controls the second switch 53 to be connected to a subsequent stage, e.g., a storage medium (not shown) as a recording medium and a holographic storage medium or an external device (not shown), while receiving the second to the $(n+1)^{st}$ timing signals. In other words, if receiving the first timing signal, the control device 47 generates a first control signal for controlling the second switch 53 to be turned on or off. When the counting unit, which has been reset on receiving the $(n+1)^{st}$ timing signal, receives a next first timing signal, the control device 47 also generates a second control signal for controlling the third switch 55 to be turned on or off.

When receiving a next $(n+1)^{st}$ timing signal, the counting unit is reset again, and then the control device 47 generates the first control signal in order to control the first switch to be turned on and off. By this means, the control device 47 can control the second switch 53 and the third switch 55 to be alternatively switched.

The A type coding device 49 encodes the first original block of m-bit message, to thereby obtain a reference block of n-bit codeword. The A type coding device 49 also encodes a part of the original blocks of m-bit message, to thereby obtain A type weighted blocks of n-bit codeword, "n" being greater than "m". The B type coding device 51 encodes the remaining part of the original blocks of m-bit message, to thereby obtain B type weighted blocks of n-bit codeword. The B type weighted blocks of n-bit codeword are transmitted to a subsequent stage, e.g., the storage medium, or the external device.

The second switch 53 is connected to the A type coding device 49. The second switch 53 is turned off, under a control of the first control signal of the control device 47 which has received the first timing signal, to thereby transmit the reference block to the control device 47. On the contrary, when the control device 47 receives the second to the $(n+1)^{st}$ timing signals, the second switch 53 is turned on, under the control of the first control signal of the control device 47, to thereby transmit the A type weighted blocks to the subsequent stage or the external device.

The third switch 55 is connected to the B type coding device 51. The third switch 55 is off, under a control of the second control signal of the control device 47 which has received a next first timing signal, to thereby transmit a next reference block, e.g., the second reference block RB2, to the control device 47. On the contrary, when the control device 47 receives the second to the $(n+1)^{st}$ timing signals, the second switch 53 is turned on, under the control of the first control signal of the control device 47, to thereby transmit the A type weighted blocks to the subsequent stage or the external device.

Figure 6:
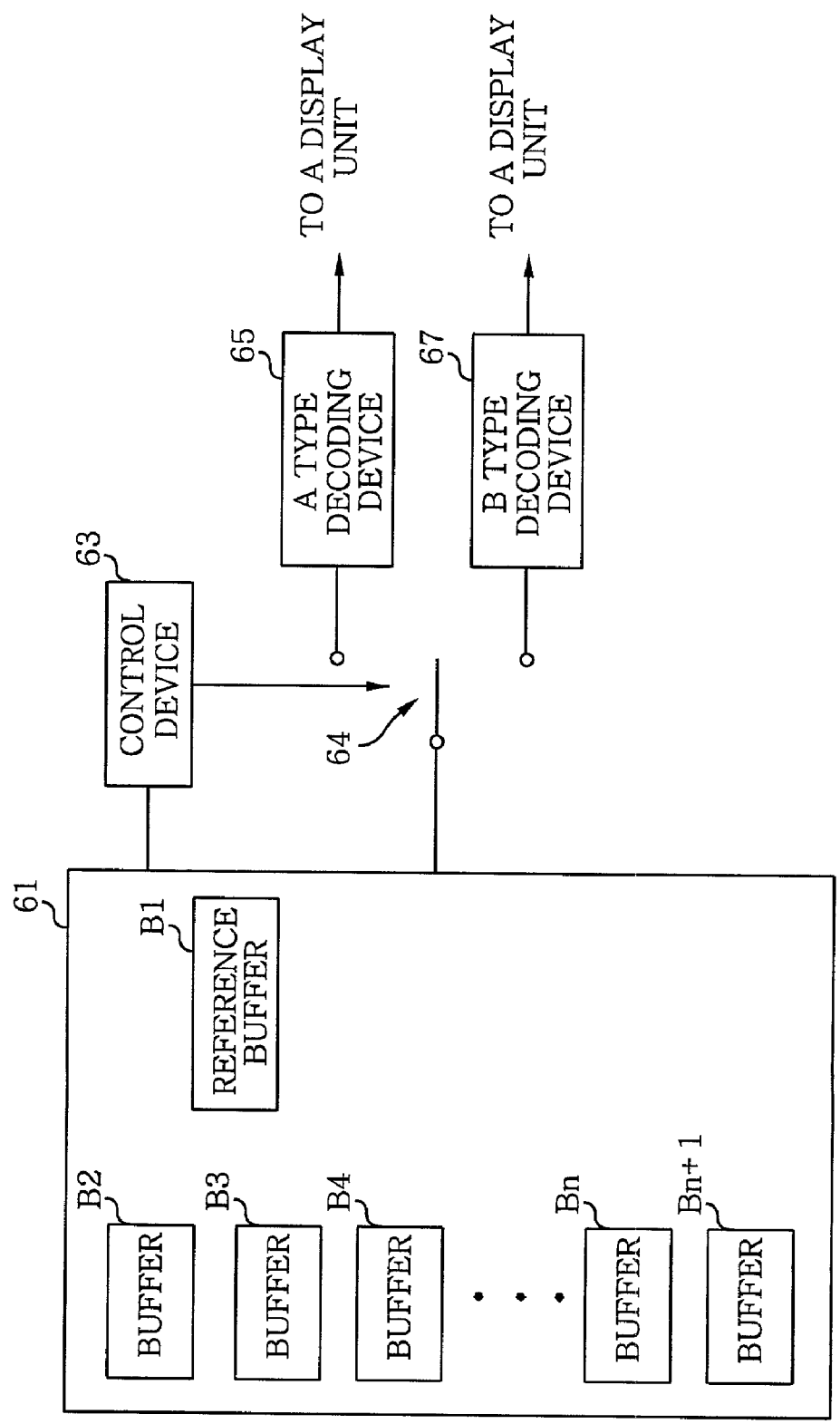
FIG. 6 supports a block diagram for illustrating a decoding system in accordance with the second preferred embodiment of the present invention.

FIG. 6 supports a block diagram for illustrating a block decoding system in accordance with the second preferred embodiment of the present invention. The block decoding system includes a buffering circuit 61, a control device 63, a switch 64, an A type decoding device 65 and a B type decoding device 67.

The buffering circuit 61 has a plurality of the buffers B1 to Bn+1. Each buffer of B2 to Bn+1 sequentially stores therein 11 bits of a weighted block provided from the block coding system. A reference buffer B1 stores a sequence of reference bits, each of which implies a weighted type of the weighted block stored in each buffer of B2 to Bn+1.

The control device 63 connected to the buffering circuit 61 sums up 11 bits of the weighted block in each buffer of B2 to Bn+1 and then determines, based on the summation result, whether the weighted block in each buffer of B2 to Bn+1 is an A type weighted block or a B type weighted block. For instance, four weighted blocks having smaller summation results are determined as A type weighted blocks and seven weighted blocks having larger summation results are determined as B type weighted blocks.

After determining the weighting type, the control device 63 stores the sequence of the reference bits, each of which implies whether each weighted block is an A type weighted block or a B type weighted block, in the reference buffer B1. Since the sequence of the reference bits is identical with the bit sequence of the reference block, the first weighted block of n-bit codeword is stored in the reference buffer B1. Therefore, all the weighted blocks are stored in the buffers B1 to Bn+1.

Further, the control device 63 controls the switch 64 to be connected with the A type decoding device 65 or the B type decoding device 67.

The switch 64 connected to the buffering circuit 61 transmits the weighted blocks provided from the buffering circuit 61 to the A type decoding device 65 or the B type decoding device 67 under the control of the control device 63.

The A type decoding device 65 and the B type decoding device 67 decode an A type weighted block and a B type weighted block to generate corresponding original blocks, respectively. It is apparent to those skilled in the art that each of the weighted blocks is provided to the A type decoding device 65 or the B type decoding device 67 according to the weighting type since the weighting types of the weighted blocks in the buffers B2 to Bn+1 have been determined as described above.

Meanwhile, the sequence of the reference bits in the reference buffer B1 is not decoded as described above. The decoding of the reference bits depends on whether the first original block is encoded to be an A type weighted block or a B type weighted block in the block coding system. For instance, if the reference block is an A type weighted block, the sequence of the reference bits is transmitted to the A type decoding device 65, and if otherwise, the sequence of the reference bits is transmitted to the B type decoding device 67.

Figure 7:
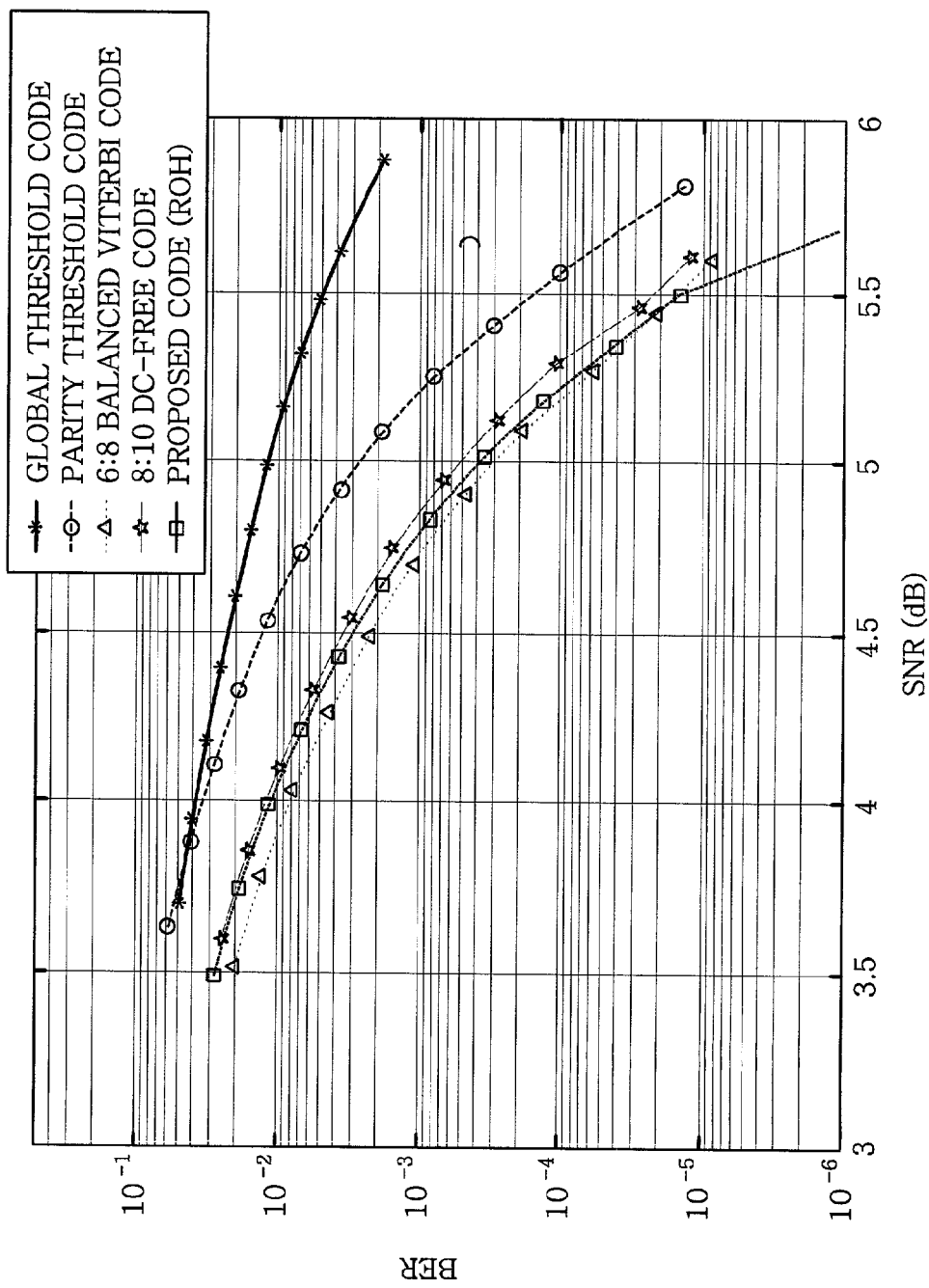
FIG. 7 provides a simulation result for the second preferred embodiment of the present invention.

The block coding and decoding algorithm in accordance with the second preferred embodiment of the present invention performs the balanced block coding and decoding, and improves a signal-to-noise ratio (SNR) and a bit-error rate (BER). The SNR of a 6:8 balanced block coding is comparable to that of the present invention, while a code rate 75% of the 6:8 balanced block coding is considerably lower than the code rate 79.3% of the present invention. Also, the code rate of a DC free-code is nearly even on that of the present invention, while the SNR of the DC fee-code is far below than that of the present invention. A simulation result for showing such characters is provided in FIG. 7.

While the invention has been shown and described with respect to the preferred embodiments, it will be understood by those skilled in the art that various changes and modifications may be made without departing from the spirit and scope of the invention as defined in the following claims.

What is claimed is:

1. A block encoding method, comprising steps of:
    forming an original block group having n+1 original blocks of m-bit message, "m" being a positive integer and "n" being an odd integer greater than "m";
    encoding a first original block of m-bit message of the original block group to a reference block of n-bit codeword; and
    encoding n original blocks of m-bit message placed after the first original block of m-bit message in the original block group to generate n weighted blocks of n-bit codeword, each of which corresponds to an A type weighted block or a B type weighted block, depending on a bit sequence of the reference block,
    wherein "a" is related to the number of bit "1" in an A type weighted block of n bits which satisfies a relation $2^m < nCa$, with "a" being a positive integer, and the number of bit "1" in a B type weighted block of n bits is given by "n−a".

2. The method of claim 1, wherein the reference block of n-bit codeword is an A type weighted block.

3. The method of claim 2, wherein a bit of "1" in the reference block corresponds to an A type weighted block.

4. The method of claim 3, wherein a bit of "0" in reference block corresponds to a B type weighted block.

5. The method of claim 1, wherein if the original block group is a $(2N-1)^{st}$ original block group, the reference block of n-bit codeword is an A type weighted block, "N" being a positive integer.

6. The method of claim 5, wherein if the original block group is a $2N^{th}$ original block group, the reference block of n-bit codeword is a B type weighted block.

7. A block decoding method, comprising steps of:
    forming a coding group having n weighted blocks of n-bit codeword, "n" being an odd integer;
    generating a sequence of reference bits from the n weighed blocks of n-bit codeword, wherein each reference bit implies that a corresponding weighted block is an A type weighted block or a B type weighted block;
    decoding the n weighted blocks of n-bit codeword of the coding group to generate n corresponding original blocks of m-bit message; and
    reconstructing a first original block of m-bit message from the sequence of the reference bits,
    wherein "a" is related to the number of bit "1" in an A type weighted block of n bits satisfies a relation $2^m < nCa$, with "a" being a positive integer, and the number of bit "1" in a B type weighted block of n bits is given by "n−a".

8. The method of claim 7, wherein the sequence of the reference bits is identical to a bit sequence of a reference block of n-bit codeword, which is generated by encoding the first original block of m-bit message.

9. The method of claim 8, wherein a bit of "1" in the reference block represents an A type weighted block.

10. The method of claim 9, wherein a bit of "0" in the reference block represents a B type weighted block.

11. The method of claim 7, wherein if the coding group is a $(2N-1)^{st}$ coding group, the reference block is an A type weighted block.

12. The method of claim 11, wherein if the coding group is a $2N^{th}$ coding group, the reference block is a B type weighted block.

13. A block encoding/decoding apparatus, comprising:
    a buffering device for outputting a digitalized image signal on a basis of an original block of m-bit message and generating a timing signal for notifying when the original block is outputted, "m" being a positive integer;
    a first control part for determining whether the original block is a first original block of m-bit message when the timing signal is first generated from the first buffer;
    an encoding part for encoding, if the original block is the first original block, the first original block as a reference block of n-bit codeword, and if otherwise, encoding the original block as a weighted block of n-bit codeword, which is represented as an A type weighted block of n-bit codeword or a B type weighted block of n-bit codeword, under a control of the first control part based on a bit sequence of the reference block, "n" being an odd integer larger than "m";
    a switch for transmitting the reference block to the first control part and transmitting the weighted block to a storage medium;
    a buffer having a reference buffer for storing a sequence of reference bits, wherein each reference bit implies whether the weighted block is an A type weighted block or a B type weighted block, and n buffers for storing bits of the weighted block provided from the storage medium;
    a second control part for determining whether the weighted block is an A type weighted block or a B type weighted block; and
    decoding part for decoding the weighted block to generate a corresponding original block of m-bit message and reconstructing the first original block from the sequence of the reference bits,
    wherein "a" is related to the number of bit "1" in an A type weighted block of n bits satisfies a relation $2^m < nCa$, with "a" being a positive integer, and the number of bit "1" in a B type weighted block of n bits is given by "n−a".

14. The apparatus of claim 13, wherein the first control part has a counting unit for counting the number of the timing signal provided from the first buffer.

15. The apparatus of claim 14, wherein the counting unit is reset on receiving an $(n+1)^{th}$ timing signal generated from the first buffer.

16. The apparatus of claim 13, wherein the reference block of n-bit codeword is an A type weighted block.

17. The apparatus of claim 16, wherein a bit of "1" in the reference block corresponds to an A type weighted block.

18. The apparatus of claim 17, wherein a bit of "0" in the reference block corresponds to a B type weighted block.

19. The apparatus of claim 13, wherein the sequence of the reference bits is identical to the bit sequence of the reference block.

* * * * *